(12) United States Patent
Sato

(10) Patent No.: US 9,607,961 B2
(45) Date of Patent: Mar. 28, 2017

(54) SEMICONDUCTOR DEVICE

(71) Applicant: Toyota Jidosha Kabushiki Kaisha, Toyota-shi Aichi-ken (JP)

(72) Inventor: Tomohiko Sato, Nissin (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 15/059,860

(22) Filed: Mar. 3, 2016

(65) Prior Publication Data

US 2016/0260678 A1 Sep. 8, 2016

(30) Foreign Application Priority Data

Mar. 4, 2015 (JP) ................................. 2015-042155

(51) Int. Cl.

| | |
|---|---|
| *H01L 29/74* | (2006.01) |
| *H01L 31/111* | (2006.01) |
| *H01L 23/00* | (2006.01) |
| *H01L 23/495* | (2006.01) |
| *H01L 29/08* | (2006.01) |
| *H01L 29/10* | (2006.01) |
| *H01L 29/739* | (2006.01) |

(Continued)

(52) U.S. Cl.
CPC ........ *H01L 24/32* (2013.01); *H01L 23/49562* (2013.01); *H01L 29/0619* (2013.01); *H01L 29/0804* (2013.01); *H01L 29/0821* (2013.01); *H01L 29/0834* (2013.01); *H01L 29/1095* (2013.01); *H01L 29/407* (2013.01); *H01L 29/7397* (2013.01); *H01L 29/402* (2013.01); *H01L 2224/32245* (2013.01); *H01L 2924/014* (2013.01); *H01L 2924/13055* (2013.01); *H01L 2924/3512* (2013.01)

(58) Field of Classification Search
CPC .. H01L 24/32; H01L 29/7397; H01L 29/0804
USPC ......................................... 257/139
See application file for complete search history.

(56) References Cited

U.S. PATENT DOCUMENTS

2004/0256730 A1   12/2004   Hirano et al.
2016/0284660 A1*  9/2016   Fukami .................. H01L 24/29

FOREIGN PATENT DOCUMENTS

JP      2005-019447 A    1/2005
JP      2007-110002 A    4/2007
(Continued)

*Primary Examiner* — David S Blum
(74) *Attorney, Agent, or Firm* — Dinsmore & Shohl LLP

(57) ABSTRACT

A semiconductor device includes a semiconductor substrate, a front surface electrode provided on a front surface of the semiconductor substrate, a solder layer, and a metal member fixed to a front surface of the front surface electrode via the solder layer. The solder layer includes an inner solder portion positioned inner than an end portion of the metal member and an outer solder portion positioned outer than the end portion of the metal member, relative to a direction along the front surface of the semiconductor substrate. The semiconductor substrate includes an inner substrate portion positioned below the inner solder portion and an outer substrate portion positioned below the outer solder portion. A density of carriers that flow from the outer substrate portion to the front surface electrode is lower than a density of carriers that flow from the inner substrate portion to the front surface electrode.

5 Claims, 8 Drawing Sheets

(51) Int. Cl.
 *H01L 29/06* (2006.01)
 *H01L 29/40* (2006.01)

(56) References Cited

FOREIGN PATENT DOCUMENTS

JP  2008-091618 A  4/2008
JP  2012-054294 A  3/2012

* cited by examiner

SEMICONDUCTOR DEVICE

CROSS-REFERENCE TO RELATED APPLICATION

This application claims priority to Japanese Patent Application No. 2015-042155 filed on Mar. 4, 2015, the entire contents of which are hereby incorporated by reference into the present application.

TECHNICAL FIELD

The present application relates to a semiconductor device.

DESCRIPTION OF RELATED ART

A semiconductor device disclosed in Japanese Patent Application Publication No. 2008-091618 includes a semiconductor substrate, a front surface electrode provided on a front surface of the semiconductor substrate, a solder layer, and a metal member fixed to a front surface of the front surface electrode via the solder layer. The solder layer includes an inner solder portion positioned inner than an end portion of the metal member and an outer solder portion positioned outer than the end portion of the metal member, relative to a direction along the front surface of the semiconductor substrate.

SUMMARY

In the semiconductor device disclosed in the above Publication, the inner solder portion, positioned inner than the end portion of the metal member, has a well-regulated shape, but the outer solder portion, positioned outer than the end portion of the metal member, does not have a well-regulated shape, as the outer solder portion is exposed from the end portion of the metal member. Specifically, a front surface of the outer solder portion is inclined with respect to the front surface of the front surface electrode. For this reason, when the solder layer expands/contracts with heat, irregularities in shape cause the outer solder portion to become more greatly distorted than the inner solder portion. Therefore, if the solder layer is heated by heat generated in the semiconductor substrate when the semiconductor device operates, the outer solder portion may become more distorted than the inner solder portion and become cracked. The generation of heat in the semiconductor substrate is attributed to carriers flowing through the semiconductor substrate while the semiconductor device is on. In view of this, the present application discloses a technology that makes it possible to prevent the outer solder portion from being heated.

A semiconductor device disclosed herein comprises a semiconductor substrate, a front surface electrode provided on a front surface of the semiconductor substrate, a solder layer, and a metal member fixed to a front surface of the front surface electrode via the solder layer. The solder layer comprises an inner solder portion positioned inner than an end portion of the metal member and an outer solder portion positioned outer than the end portion of the metal member, relative to a direction along the front surface of the semiconductor substrate. The semiconductor substrate comprises an inner substrate portion positioned below the inner solder portion and an outer substrate portion positioned below the outer solder portion. A density of carriers that flow from the outer substrate portion to the front surface electrode is lower than a density of carriers that flow from the inner substrate portion to the front surface electrode.

With such a configuration, the density of carriers that flow from the outer substrate portion to the front surface electrode is lower than the density of carriers that flow from the inner substrate portion to the front surface electrode. Accordingly, when the semiconductor device is turned on and the semiconductor substrate is heated through the operation of the semiconductor device, less heat is generated in the outer substrate portion than in the inner substrate portion. The generation of heat in the outer substrate portion is reduced by suppressing a density of carriers that flow through the outer substrate portion. For this reason, a rise in temperature of the outer substrate portion can be suppressed. Accordingly, the outer solder portion positioned above the outer substrate portion can be prevented from being heated. This therefore makes it possible to prevent the solder layer from becoming cracked.

DETAILED DESCRIPTION

First Embodiment

Figure 1:
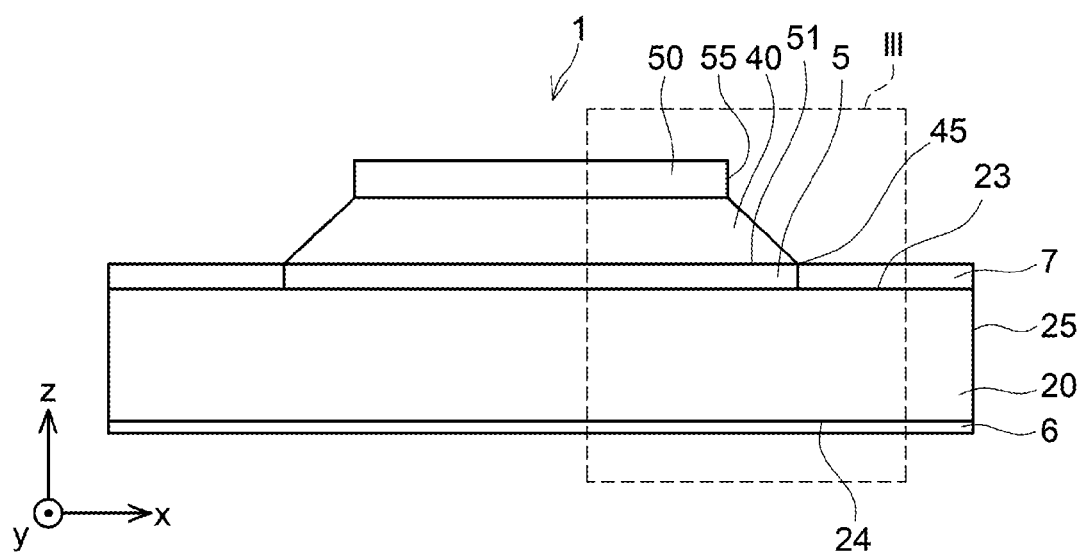
FIG. 1 is a side view of a semiconductor device according to a first embodiment.

As shown in FIG. 1, a semiconductor device 1 according to a first embodiment includes a semiconductor substrate 20, a front surface electrode 5 provided on a portion of a front surface 23 of the semiconductor substrate 20, a front surface insulating film 7 provided on another portion of the front surface 23 of the semiconductor substrate 20, and a back surface electrode 6 provided on a back surface 24 of the semiconductor substrate 20. Further, the semiconductor device 1 includes a solder layer 40 and a metal member 50 fixed to a front surface 51 of the front surface electrode 5 via the solder layer 40.

Figure 2:
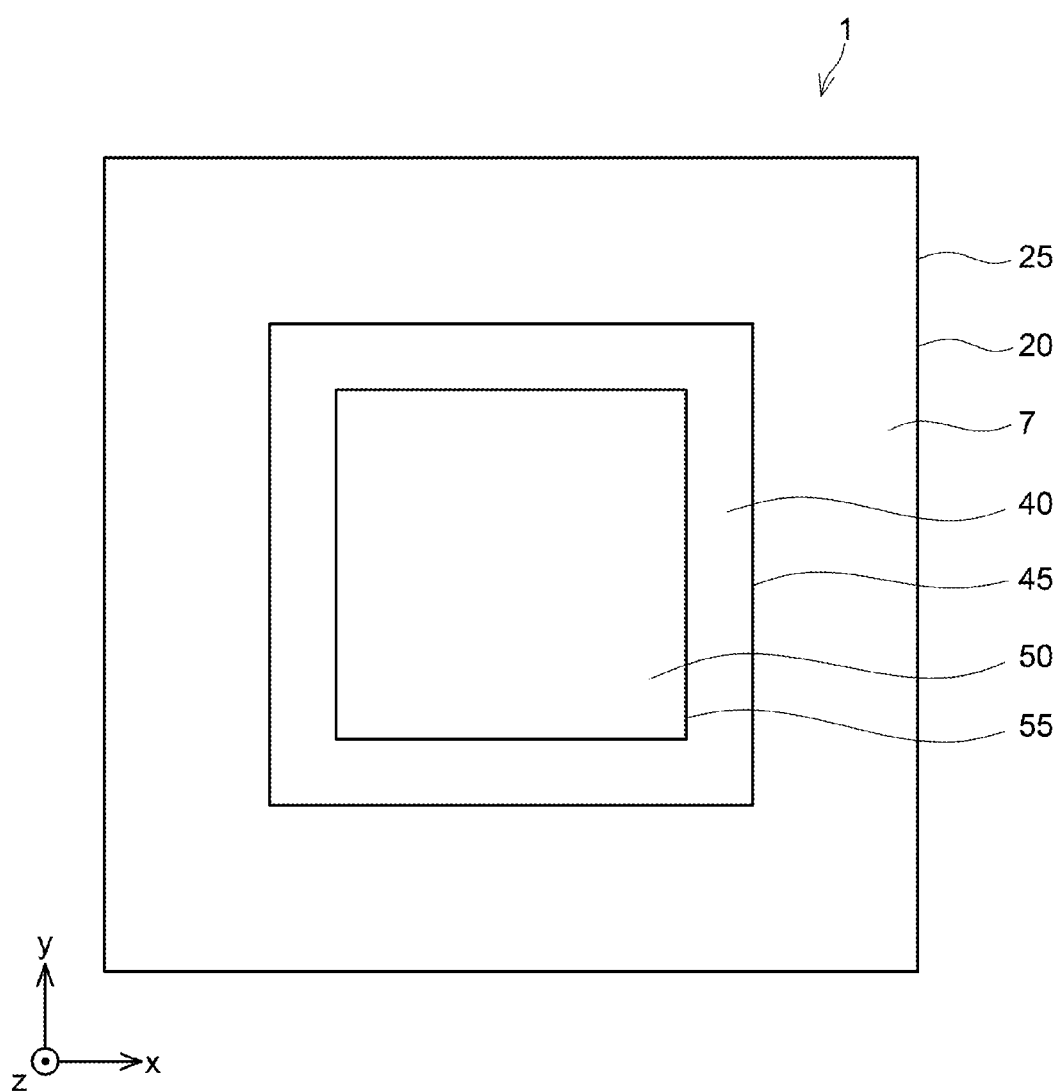
FIG. 2 is a plan view of the semiconductor device according to the first embodiment.

The metal member 50 is in the form of a plate, and is configured for example of a metal having electrical conductivity and thermal conductivity, such as copper (Cu) or aluminum (Al). The metal member 50 is located on the solder layer 40. As shown in FIG. 2, the metal member 50 has a quadrangular shape in a plan view. The metal member 50 is electrically connected to an external terminal (not illustrated).

The solder layer 40 is configured for example of an alloy composed mainly of tin (Sn), silver (Ag), or copper (Cu). The solder layer 40 has electrical conductivity and thermal conductivity. As shown in FIG. 1, the solder layer 40 is located between the metal member 50 and the front surface electrode 5. The solder layer 40 is formed by filling a space between the metal member 50 and the front surface electrode 5 with a solder material. As shown in FIG. 2, the solder layer 40 has a quadrangular shape in the plan view. In the plan view, an area of the solder layer 40 is larger than an area of the metal member 50. An end portion 45 of the solder layer 40 is positioned outer than an end portion 55 of the metal member 50.

Figure 3:
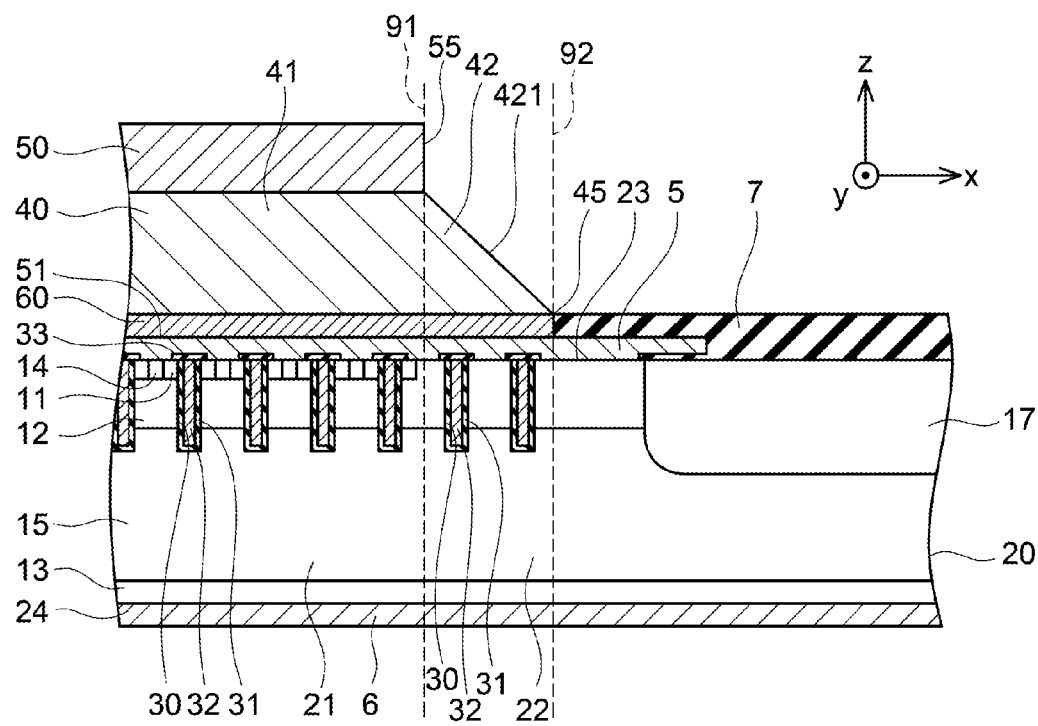
FIG. 3 is a cross-sectional view of a main part III in FIG. 1.

As shown in FIG. 3, the solder layer 40 joins the metal member 50 and the front surface electrode 5. The solder layer 40 is fixed to the front surface 51 of the front surface electrode 5 via a bonding film 60. The bonding film 60 is configured for example of nickel (Ni) or copper (Cu). The bonding film 60 is located between the solder layer 40 and the front surface electrode 5.

The solder layer 40 includes an inner solder portion 41 and an outer solder portion 42. The outer solder portion 42 is sometimes also referred to as "fillet". The inner solder portion 41 and the outer solder portion 42 are integrally formed. The inner solder portion 41 is positioned inner than the end portion 55 of the metal member 50 relative to a direction (x direction) along the front surface 23 of the semiconductor substrate 20. The outer solder portion 42 is positioned outer than the end portion 55 of the metal member 50 relative to the direction (x direction) along the front surface 23 of the semiconductor substrate 20. The inner solder portion 41 is provided inner than an inner boundary 91, which is a boundary extending along a depth direction (z direction) of the semiconductor substrate 20 through the end portion 55 of the metal member 50. Further, the outer solder portion 42 is provided between the inner boundary 91 and an outer boundary 92. The outer boundary 92 is a boundary extending along the depth direction (z direction) of the semiconductor substrate 20 through the end portion 45 of the solder layer 40. The metal member 50 is positioned above the inner solder portion 41. The metal member 50 is not present above the outer solder portion 42. The outer solder portion 42 is exposed from the metal member 50. A front surface 421 of the outer solder portion 42 is inclined with respect to the front surface 23 of the semiconductor substrate 20. The front surface 421 of the outer solder portion 42 is exposed to an outside.

The front surface electrode 5 and the back surface electrode 6 are each configured for example of a metal such as aluminum (Al) or copper (Cu). The front surface insulating film 7 is configured for example of silicon oxide ($SiO_2$). The front surface electrode 5 covers the front surface 23 of the semiconductor substrate 20. The back surface electrode 6 covers the back surface 24 of the semiconductor substrate 20. The front surface insulating film 7 is provided outer than the end portion 45 of the solder layer 40.

The semiconductor substrate 20 is configured for example of silicon (Si) or silicon carbide (SiC). As shown in FIG. 2, the semiconductor substrate 20 has a quadrangular shape in the plan view. In the plan view, an area of the semiconductor substrate 20 is larger than the area of the solder layer 40. An end portion 25 of the semiconductor substrate 20 is positioned outer than the end portion 45 of the solder layer 40. In the plan view, the area of the semiconductor substrate 20 is larger than the area of the metal member 50. The end portion 25 of the semiconductor substrate 20 is positioned outer than the end portion 55 of the metal member 50.

As shown in FIG. 3, the semiconductor substrate 20 includes an inner substrate portion 21 and an outer substrate portion 22. The inner substrate portion 21 and the outer substrate portion 22 are integrally formed. The inner substrate portion 21 is positioned inner than the end portion 55 of the metal member 50 relative to a direction along the front surface 23 of the semiconductor substrate 20. The outer substrate portion 22 is positioned outer than the end portion 55 of the metal member 50 relative to the direction along the front surface 23 of the semiconductor substrate 20. The inner substrate portion 21 is provided inner than the inner boundary 91. The outer substrate portion 22 is provided between the inner boundary 91 and the outer boundary 92. The metal member 50 is positioned above the inner substrate portion 21. The metal member 50 is not present above the outer substrate portion 22. A front surface of the inner substrate portion 21 and a front surface of the outer substrate portion 22 are covered with the front surface electrode 5. A back surface of the inner substrate portion 21 and a back surface of the outer substrate portion 22 are covered with the back surface electrode 6.

The inner substrate portion 21 is positioned below the inner solder portion 41. The outer substrate portion 22 is positioned below the outer solder portion 42. The inner solder portion 41 and the inner substrate portion 21 are aligned along the depth direction of the semiconductor substrate 20. The outer solder portion 42 and the outer substrate portion 22 are aligned along the depth direction of the semiconductor substrate 20.

A semiconductor element is provided in the semiconductor substrate 20. In the present embodiment, a vertical IGBT (insulated gate bipolar transistor) is provided in the semiconductor substrate 20. Specifically, a plurality of gate trenches 30 is provided in the semiconductor substrate 20. Further, a collector region 13, a drift region 15, and a body region 12 are provided in the semiconductor substrate 20 in this order from the back surface 24 to the front surface 23. Further, emitter regions 11 and contact regions 14 are provided in the semiconductor substrate 20. Further, an FLR region 17 is provided in the semiconductor substrate 20.

The gate trenches 30 extend from the front surface 23 of the semiconductor substrate 20 toward the back surface 24 of the semiconductor substrate 20 (along the z direction). Each of the gate trenches 30 extends from the front surface 23 of the semiconductor substrate 20, pierces the corresponding emitter region 11 and the body region 12 and reaches the drift region 15. The plurality of gate trenches 30 is provided at regular intervals. The gate trenches 30 are each provided in the inner substrate portion 21 and outer substrate portion 22 of the semiconductor substrate 20. A gate electrode 32 and a gate insulating film 31 are provided inside each of the gate trenches 30.

The gate electrodes 32 are configured for example of aluminum or polysilicon. Each of the gate electrodes 32 is accommodated inside the corresponding gate trench 30. Each of the gate electrodes 32 is accommodated inner than the corresponding gate insulating film 31. An interlayer insulating film 33 is located on each of the gate electrodes 32. Each of the interlayer insulating films 33 insulates the corresponding gate electrode 32, respectively, from the front surface electrode 5.

The gate insulating films 31 are configured for example of silicon oxide ($SiO_2$). Each of the gate insulating films 31 is provided on an inner surface of the corresponding gate trench 30. Each of the gate insulating films 31 is located between its corresponding gate electrode 32 and the semiconductor substrate 20. Each of the gate insulating films 31 insulates the corresponding gate electrode 32, from the semiconductor substrate 20.

The collector region 13 is an n-type region. The collector region 13 has a high density of impurities. The collector region 13 is provided on a back surface side of the drift region 15. The collector region 13 is provided in the inner substrate portion 21 and outer substrate portion 22 of the semiconductor substrate 20. The collector region 13 is provided in an area exposed on the back surface 24 of the semiconductor substrate 20. The collector region 13 is in ohmic contact with the back surface electrode 6.

The drift region 15 is an n-type region. The drift region 15 has a lower density of impurities than the collector region 13 does. The drift region 15 is provided on a front surface side of the collector region 13. The drift region 15 is provided between the body region 12 and the collector region 13. The drift region 15 is provided in the inner substrate portion 21 and outer substrate portion 22 of the semiconductor substrate 20.

The body region 12 is a p-type region. The body region 12 has a low density of impurities. The body region 12 is provided on a front surface side of the drift region 15 and in an area being in contact with the gate trenches 30. The body region 12 is provided in the inner substrate portion 21 and outer substrate portion 22 of the semiconductor substrate 20. When the gate electrodes 32 reach an on-potential, channels are formed in portions of the body region 12 that are in contact with the gate trenches 30.

The emitter regions 11 are n-type regions. Each of the emitter regions 11 has a high density of impurities. The emitter region 11 is provided on a front surface side of the body region 12 and in an area being in contact with the corresponding gate trench 30. The emitter regions 11 are provided in the form of islands in areas exposed on the front surface 23 of the semiconductor substrate 20. In the present embodiment, a plurality of the emitter regions 11 is provided in the inner substrate portion 21. The emitter regions 11 are not provided in the outer substrate portion 22. Therefore, a density of the emitter regions 11 in the outer substrate portion 22 is lower than a density of the emitter regions 11 in the inner substrate portion 21. The emitter regions 11 are in ohmic contact with the front surface electrode 5.

The contact regions 14 are p-type regions. Each of the contact regions 14 has a higher density of impurities than the body region 12 does. The contact region 14 is provided on the front surface side of the body region 12 and in a position between adjacent emitter regions 11. The contact region 14 is provided lateral to the emitter regions 11. The contact regions 14 are provided in the form of islands in areas exposed on the front surface 23 of the semiconductor substrate 20. In the present embodiment, the contact regions 14 are provided in the inner substrate portion 21 of the semiconductor substrate 20. The contact regions 14 are not provided in the outer substrate portion 22. The contact regions 14 are in ohmic contact with the front surface electrode 5.

The FLR region 17 is a p-type region. The FLR region 17 has a high density of impurities. The FLR region 17 is provided on the front surface side of the drift region 15. The FLR region 17 is provided in an area exposed on the front surface 23 of the semiconductor substrate 20. The FLR region 17 is provided outer than the outer substrate portion 22 of the semiconductor substrate 20.

In using the semiconductor device 1 thus configured, such a voltage is applied between the front surface electrode 5 and the back surface electrode 6 that the back surface electrode 6 becomes positive. Further, an on-potential (i.e. a potential equal to or higher than a potential required for channels to be formed in the body region 12) is applied to the gate electrodes 32. Application of an on-potential to the gate electrodes 32 causes channels to be formed in the areas in the body region 12 that are in contact with the gate trenches 30. This causes the IGBT to be turned on. This causes electrons to flow from the front surface electrode 5 to the back surface electrode 6 via the emitter regions 11, the channels formed in the body region 12, the drift region 15, and the collector region 13. Further, holes flow from the back surface electrode 6 to the front surface electrode 5 via the collector region 13, the drift region 15, the body region 12, and the contact regions 14. Therefore, a current flows from the back surface electrode 6 to the front surface electrode 5. At this occasion, no carriers flow from the outer substrate portion 22 to the front surface electrode 5, as the emitter regions 11 are not provided in the outer substrate portion 22 of the semiconductor substrate 20 in the present embodiment.

It is evident, from the foregoing descriptions, that in the semiconductor device 1, the solder layer 40 includes the inner solder portion 41 positioned inner than the end portion 55 of the metal member 50 and the outer solder portion 42 positioned outer than the end portion 55 of the metal member 50, relative to the direction along the front surface 23 of the semiconductor substrate 20. Further, the semiconductor substrate 20 includes the inner substrate portion 21 positioned below the inner solder portion 41 and the outer substrate portion 22 positioned below the outer solder portion 42. Further, the density of the emitter regions 11 in the outer substrate portion 22 is lower than the density of the emitter regions 11 in the inner substrate portion 21. Accordingly, while the semiconductor device 1 is on, a density of carriers that flow from the outer substrate portion 22 to the front surface electrode 5 is lower than a density of carriers that flow from the inner substrate portion 21 to the front surface electrode 5. It should be noted that a case where no carriers flow is encompassed in a concept of "low density of carriers".

With such a configuration, the density of carriers that flow from the outer substrate portion 22 to the front surface electrode 5 is lower than the density of carriers that flow from the inner substrate portion 21 to the front surface electrode 5. Accordingly, when the semiconductor substrate 20 is heated through the operation of the semiconductor device 1, less heat is generated in the outer substrate portion 22 than in the inner substrate portion 21. The generation of heat in the semiconductor substrate 20 is attributed to flow of carriers through the semiconductor substrate 20 while the semiconductor device 1 is on. Since less heat is generated in the outer substrate portion 22 than in the inner substrate portion 21, a rise in temperature of the outer substrate portion 22 can be suppressed. Accordingly, the outer solder portion 42 positioned above the outer substrate portion 22 can be prevented from being heated. This therefore makes it possible to prevent the outer solder layer 42 from becoming distorted, and makes it possible to prevent the outer solder layer 42 from becoming cracked.

A density of carriers disclosed herein corresponds to an effective carrier density. The effective carrier density corresponds to a value obtained by dividing an effective carrier quantity by an area of a portion through which carriers flow. The effective carrier quantity is an index by which a quantity of carriers that move through a channel portion is evaluated. The effective carrier quantity is typically calculated by multiplying the area of a channel portion by a quantity of inverted carriers that are formed in the channel portion (i.e. carriers that are formed on a trench side wall when an on-potential is applied to a gate electrode, and are different in polarity from a body layer).

It should be noted that a density of carriers disclosed herein is a density of carriers that flow while the semiconductor device 1 is on, not a density of carriers that flow when the semiconductor device 1 is turned off.

The foregoing has described one embodiment. However, a specific aspect is not limited to the embodiment. In the following, components that are the same as those of the embodiment described above are given the same reference signs, and as such, will not be described.

Second Embodiment

Figure 4:
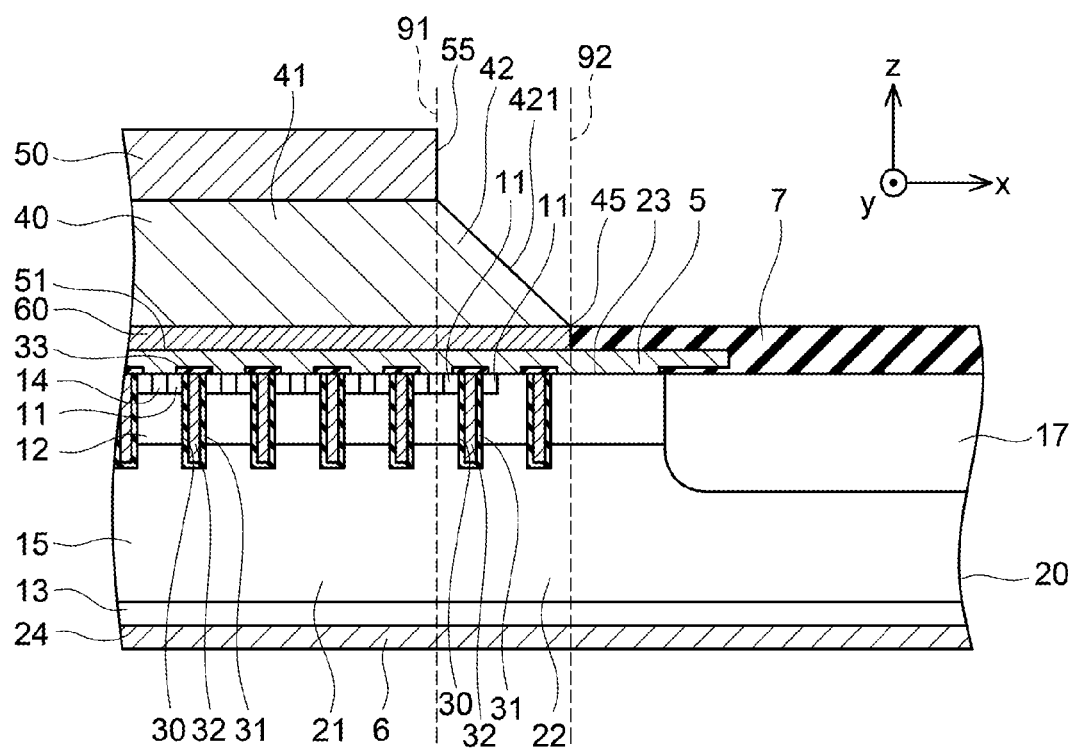
FIG. 4 is a cross-sectional view of a main part of a semiconductor device according to a second embodiment.

In the embodiment described above, no emitter regions 11 are provided in the outer substrate portion 22 of the semiconductor substrate 20. However, this configuration does not imply any limitation. In a second embodiment, as shown in FIG. 4, a plurality of emitter regions 11 is provided in the outer substrate portion 22 of the semiconductor substrate 20. The emitter regions 11 are provided in areas being in contact with a part of the plurality of gate trenches 30 provided in the outer substrate portion 22. The emitter regions 11 are not provided in areas being in contact with another part of the plurality of gate trenches 30 provided in the outer substrate portion 22. Therefore, a density of the emitter regions 11 in the outer substrate portion 22 is lower than a density of the emitter regions 11 in the inner substrate portion 21. In the cross-sectional view shown in FIG. 4, a number of emitter regions 11 per unit area in the outer substrate portion 22 is smaller than a number of emitter regions 11 per unit area in the inner substrate portion 21.

In forming the plurality of emitter regions 11 in the semiconductor substrate 20, the front surface 23 of the semiconductor substrate 20 is covered with a mask having a plurality of openings, and impurities are implanted into the semiconductor substrate 20 through the plurality of openings. In manufacturing a semiconductor substrate 20 in which the density of emitter regions 11 in the outer substrate portion 22 is different from that in the inner substrate portion 21, a mask having different densities of openings for the outer substrate portion 22 and the inner substrate portion 21 is used. In this way, a semiconductor substrate 20 in which the densities of emitter regions 11 in the outer substrate portion 22 and the inner substrate portion 21 are different, can be manufactured simply by using the mask having the different densities of openings. This reduces manufacturing costs and time. Further, since the plurality of gate trenches 30 is provided in the outer substrate portion 22 of the semiconductor substrate 20, occurrence of a concentration of electric fields in the outer substrate portion 22 can be prevented.

A comparison between the density of the emitter regions 11 in the outer substrate portion 22 and the density of the emitter regions 11 in the inner substrate portion 21 may be a comparison based on an area of emitter regions 11 per unit area, as well as a comparison based on the number of emitter regions 11 per unit area.

Third Embodiment

Figure 5:
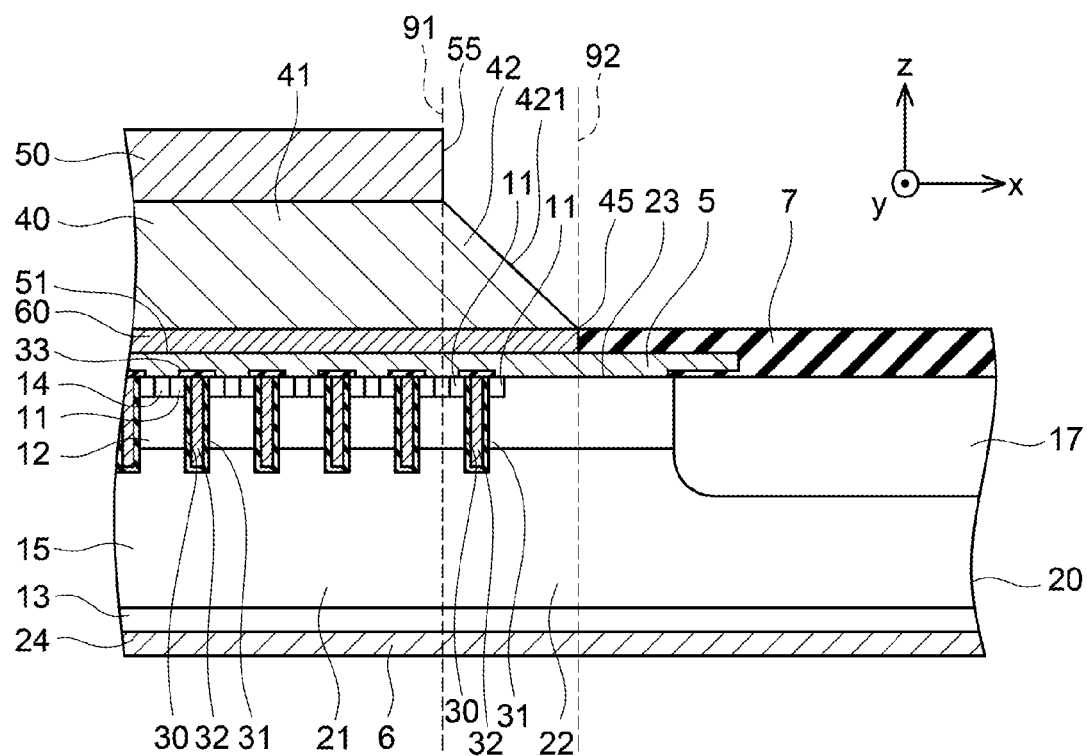
FIG. 5 is a cross-sectional view of a main part of a semiconductor device according to a third embodiment.

Each of the embodiments described above is configured such that, in the semiconductor substrate 20, the density of the emitter regions 11 in the outer substrate portion 22 is lower than the density of the emitter regions 11 in the inner substrate portion 21. Accordingly, the density of carriers that flow from the outer substrate portion 22 to the front surface electrode 5 is lower than the density of carriers that flow from the inner substrate portion 21 to the front surface electrode 5. However, the configuration in which the densities of carriers of the outer substrate portion 22 and the inner substrate portion 21 are different is not limited to this configuration. In a third embodiment, as shown in FIG. 5, in the semiconductor substrate 20, a density of gate trenches 30 in the outer substrate portion 22 is lower than a density of gate trenches 30 in the inner substrate portion 21. In the cross-sectional view shown in FIG. 5, the number of gate trenches 30 per unit area in the outer substrate portion 22 is lower than the number of gate trenches 30 per unit area in the inner substrate portion 21. In the example shown in FIG. 5, only one gate trench 30 is provided in the outer substrate portion 22. However, this configuration does not imply any limitation. A plurality of gate trenches 30 may be provided in the outer substrate portion 22. In a case where the plurality of gate trenches 30 is provided in the outer substrate portion 22, an interval between gate trenches 30 provided in the outer substrate portion 22 is greater than an interval between gate trenches 30 provided in the inner substrate portion 21.

A configuration in which the density of gate trenches 30 in the outer substrate portion 22 and the density in the inner substrate portion 21 are different, is not limited to the configuration described above. No gate trenches 30 may be provided in the outer substrate portion 22. Accordingly, while the semiconductor device 1 is on, the density of carriers that flow from the outer substrate portion 22 to the front surface electrode 5 is lower than the density of carriers that flow from the inner substrate portion 21 to the front surface electrode 5. With such a configuration, the concentration of electric fields in the outer substrate portion 22 can be reduced, as the densities of gate trenches 30 in the inner substrate portion 21 and outer substrate portion 22 are different.

Fourth Embodiment

Figure 6:
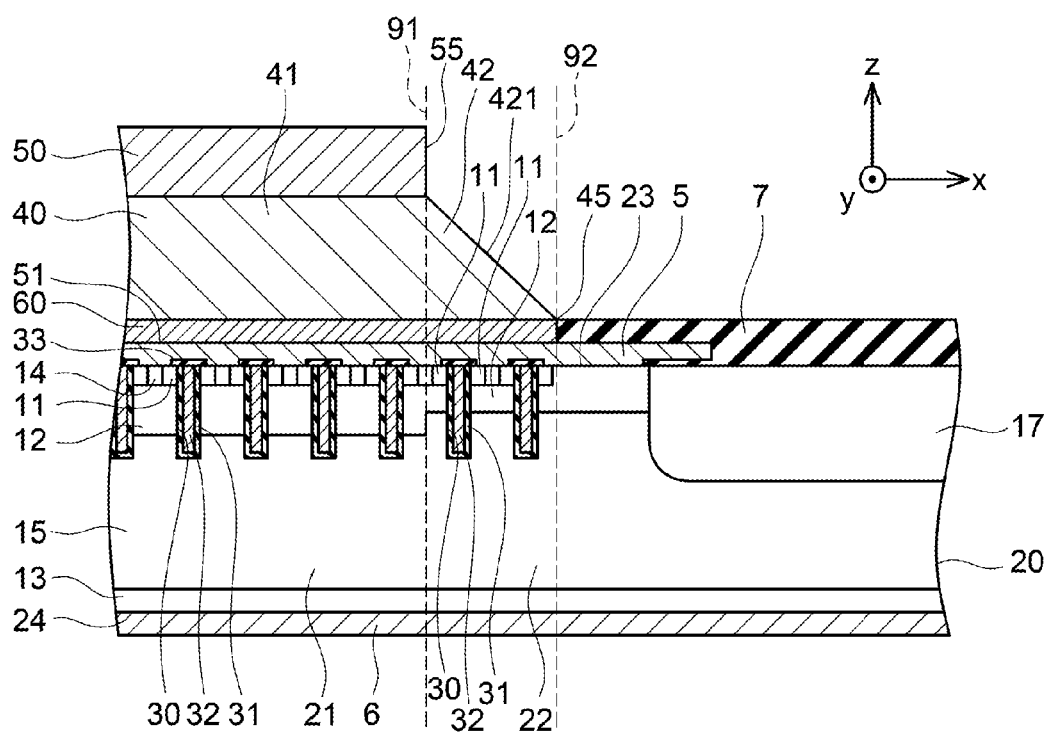
FIG. 6 is a cross-sectional view of a main part of a semiconductor device according to a fourth embodiment.

A configuration in which densities of carriers of the outer substrate portion 22 and inner substrate portion 21 are different is not limited to any of the embodiments described above. In a fourth embodiment, as shown in FIG. 6, a bottom end portion of the body region 12 in the outer substrate portion 22 of the semiconductor substrate 20 is located at a shallower position in the semiconductor substrate 20 than a bottom end portion of the body region 12 in the inner substrate portion 21(the bottom end portion of the body region 12 in the inner substrate portion 21 is located at a deeper position in the semiconductor substrate 20 than the bottom end portion of the body region 12 in the outer substrate portion 22). A step is provided between the body region 12 in the inner substrate portion 21 and the body region 12 in the outer substrate portion 22. The bottom end portion of the body region 12 in the inner substrate portion 21 projects more downward than the bottom end portion of the body region 12 in the outer substrate portion 22. This makes it easier for holes flowing from the drift region 15 to the body region 12 to flow through a portion of the body region 12 in the inner substrate portion 21 than through a portion of the body region 12 in the outer substrate portion 22. Accordingly, while the semiconductor device 1 is on, the density of carriers that flow from the outer substrate portion 22 to the front surface electrode 5 is lower than the density of carriers that flow from the inner substrate portion 21 to the front surface electrode 5. This allows the semiconductor device 1 to have higher switching resistance.

Fifth Embodiment

Figure 7:
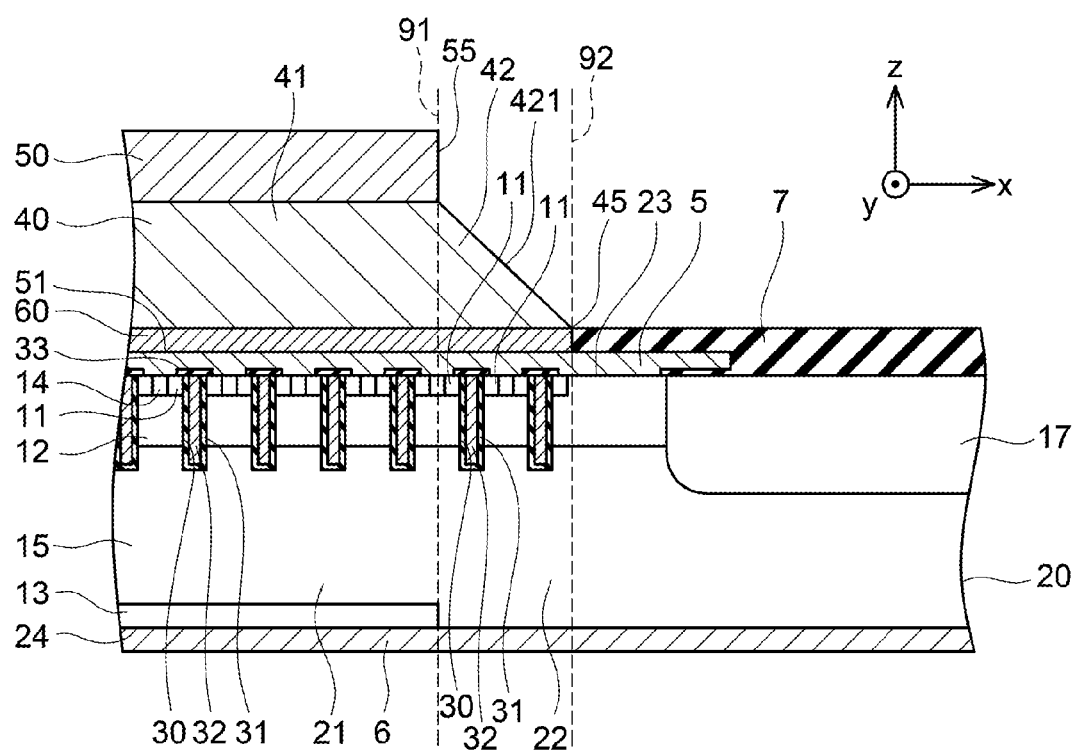
FIG. 7 is a cross-sectional view of a main part of a semiconductor device according to a fifth embodiment.

In a fifth embodiment, as shown in FIG. 7, the collector region 13 is not provided in the outer substrate portion 22 of the semiconductor substrate 20. The collector region 13 is provided only in the inner substrate portion 21. The collector region 13 is provided inner than the end portion 55 of the metal member 50. For this reason, a density of the collector region 13 in the outer substrate portion 22 of the semiconductor substrate 20 is lower than a density of the collector region 13 in the inner substrate portion 21. Accordingly, while the semiconductor device 1 is on, the density of carriers that flow from the outer substrate portion 22 to the front surface electrode 5 is lower than the density of carriers that flow from the inner substrate portion 21 to the front surface electrode 5. Alternatively, without being limited to this configuration, the collector region 13 may be provided in a portion of the outer substrate portion 22.

With such a configuration, a density of holes that flow from the collector region 13 in the outer substrate portion 22 to the semiconductor substrate 20 is low while the semiconductor device 1 is on, as the density of the collector region 13 in the outer substrate portion 22 is low. This allows the semiconductor device 1 to have higher switching resistance.

Another Embodiment

Figure 8:
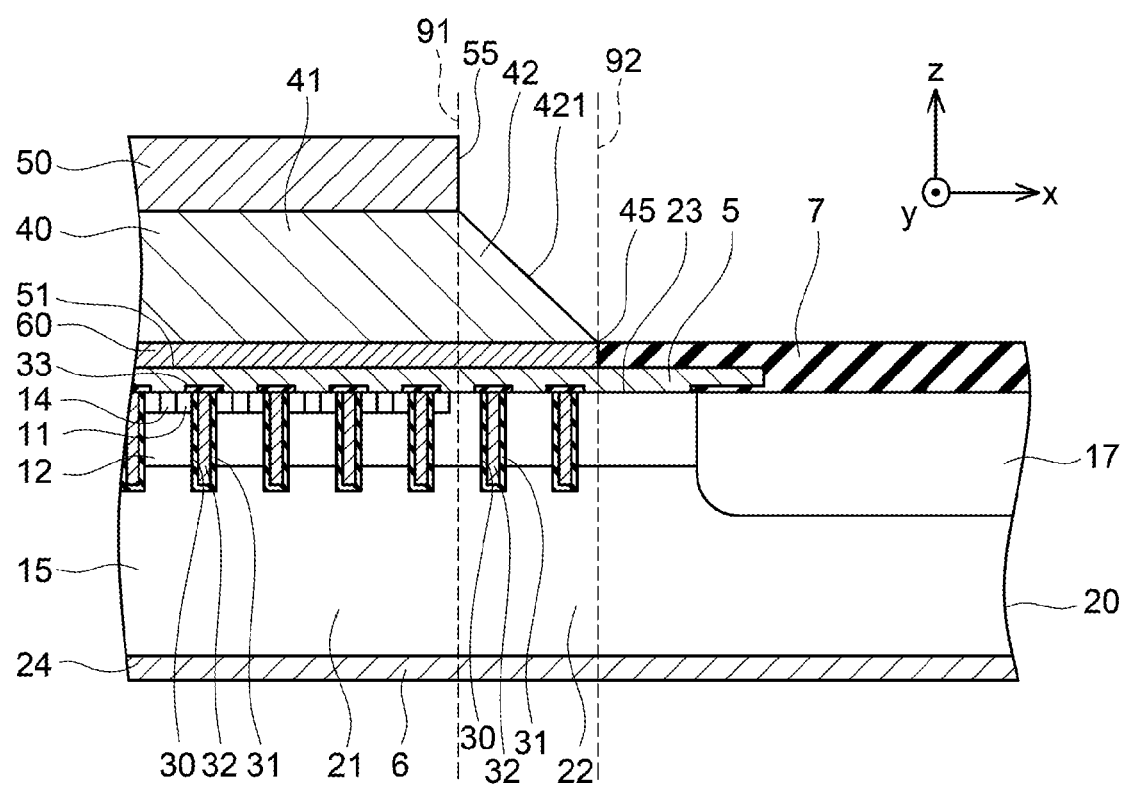
FIG. 8 is a cross-sectional view of a main part of a semiconductor device according to another embodiment.

In each of the embodiments described above, explanations have been given to the IGBT as a semiconductor element provided in the semiconductor substrate 20. However, this configuration does not imply any limitation. In another embodiment, as shown in FIG. 8, the semiconductor element may be a MOSFET (Metal Oxide Semiconductor Field Effect Transistor). Further, in each of the embodiments described above, a configuration of the semiconductor substrate 20 outer than the outer substrate portion 22 is not particularly limited. That is, a configuration outer than the outer boundary 92 is not particularly limited. Further, the metal member 50 may for example be a lead frame that is connected to an external terminal, a spacer that is located between a lead frame and the semiconductor substrate 20, or the like.

While specific examples of the present specification have been described above in detail, these examples are merely illustrative and place no limitation on the scope of the claims. The technology described in the claims also encompasses various changes and modifications to the specific examples described above. The technical elements explained in the present description or drawings provide technical utility either independently or through various combinations. The present specification is not limited to the combinations described at the time the claims are filed. Further, the purpose of the examples illustrated by the present description or drawings is to satisfy multiple objectives simultaneously, and satisfying any one of those objectives gives technical utility to the present specification.

Some of the features characteristic to below-described embodiments will herein be listed. It should be noted that the respective technical elements are independent of one another, and are useful solely or in combinations. The combinations thereof are not limited to those described in the claims as originally filed.

1. A plurality of gate trenches may be provided in the semiconductor substrate. The gate trenches may extend from the front surface of the semiconductor substrate along a depth direction of the semiconductor substrate. A density of the gate trenches in the outer substrate portion may be lower than a density of the gate trenches in the inner substrate portion.

2. A plurality of emitter regions may be provided in an area exposed on the front surface of the semiconductor substrate. A density of the emitter regions in the outer substrate portion may be lower than a density of the emitter regions in the inner substrate portion.

3. At least one collector region may be provided in an area exposed on a back surface of the semiconductor substrate. A density of the collector regions in the outer substrate portion may be lower than a density of the collector regions in the inner substrate portion.

4. A body region extending along the depth direction of the semiconductor substrate may be provided in an area being in contact with the gate trenches. A bottom end portion of the body region in the outer substrate portion may be located at a shallower position than a bottom end portion of the body region in the inner substrate portion.

What is claimed is:

1. A semiconductor device comprising:
   a semiconductor substrate;
   a front surface electrode provided on a front surface of the semiconductor substrate;
   a solder layer; and
   a metal member fixed to a front surface of the front surface electrode via the solder layer,
   wherein
   the solder layer comprises an inner solder portion positioned inner than an end portion of the metal member and an outer solder portion positioned outer than the end portion of the metal member, relative to a direction along the front surface of the semiconductor substrate,
   the semiconductor substrate comprises an inner substrate portion positioned below the inner solder portion and an outer substrate portion positioned below the outer solder portion, and
   a density of carriers that flow from the outer substrate portion to the front surface electrode is lower than a density of carriers that flow from the inner substrate portion to the front surface electrode.

2. The semiconductor device according to claim 1, wherein
   a plurality of gate trenches is provided in the semiconductor substrate, wherein the gate trenches extend from the front surface of the semiconductor substrate along a depth direction of the semiconductor substrate, and
   a density of the gate trenches in the outer substrate portion is lower than a density of the gate trenches in the inner substrate portion.

3. The semiconductor device according to claim 1, wherein
   a plurality of emitter regions is provided in an area exposed on the front surface of the semiconductor substrate, and
   a density of the emitter regions in the outer substrate portion is lower than a density of the emitter regions in the inner substrate portion.

4. The semiconductor device according to claim 1, wherein
   at least one collector region is provided in an area exposed on a back surface of the semiconductor substrate, and
   a density of the collector regions in the outer substrate portion is lower than a density of the collector regions in the inner substrate portion.

5. The semiconductor device according to claim 2, wherein
   a body region extending along the depth direction of the semiconductor substrate is provided in an area being in contact with the gate trenches, and
   a bottom end portion of the body region in the outer substrate portion is located at a shallower position in the semiconductor substrate than a bottom end portion of the body region in the inner substrate portion.

* * * * *